United States Patent [19]

Dahlin et al.

[11] Patent Number: 5,182,753
[45] Date of Patent: Jan. 26, 1993

[54] METHOD OF TRANSMITTING SIGNALING MESSAGES IN A MOBILE RADIO COMMUNICATION SYSTEM

[75] Inventors: Jan E. A. S. Dahlin, Järfälla; Krister A. Raith, Kista, both of Sweden

[73] Assignee: Telefonaktiebolaget L M Ericsson, Stockholm, Sweden

[21] Appl. No.: 899,166

[22] Filed: Jun. 15, 1992

Related U.S. Application Data

[63] Continuation of Ser. No. 497,517, Mar. 20, 1990, abandoned.

[51] Int. Cl.$^5$ .............................................. G06F 11/10
[52] U.S. Cl. .................................. 371/43; 370/110.1; 379/60; 381/31; 455/33.2
[58] Field of Search ............... 371/43, 45, 38.1, 39.1; 381/29, 31; 455/33; 379/59, 60; 370/110.1, 110.2; 375/34, 122

[56] References Cited

U.S. PATENT DOCUMENTS

| | | | |
|---|---|---|---|
| 3,714,650 | 1/1973 | Fuller et al. | 343/6.5 LC |
| 4,288,868 | 9/1981 | Grotjohann et al. | 370/110.1 |
| 4,352,955 | 10/1982 | Kai et al. | 370/110.1 |
| 4,437,182 | 3/1984 | Lambert et al. | 370/110.1 |
| 4,466,095 | 8/1984 | Kawano et al. | 370/110.1 |
| 4,587,652 | 5/1986 | Goldman | 370/110.1 |
| 4,740,958 | 4/1988 | Duxbury et al. | 370/110.1 |
| 4,754,455 | 6/1988 | Yasunaga | 370/110.1 |
| 4,791,639 | 12/1988 | Afheld et al. | 370/110.1 |
| 4,903,301 | 2/1990 | Kondo et al. | 381/31 |
| 4,912,765 | 3/1990 | Virupaksha | 381/31 |
| 4,920,567 | 4/1990 | Malek | 380/33 |
| 4,949,395 | 8/1990 | Rydbeck | 455/33 |
| 4,991,215 | 2/1991 | Taguchi | 381/38 |
| 4,995,083 | 2/1991 | Baker et al. | 455/33 |
| 4,995,097 | 2/1991 | Leclerc | 455/33 |
| 5,001,703 | 3/1991 | Johnson et al. | 370/79 |
| 5,008,953 | 4/1991 | Dahlin et al. | 455/33 |
| 5,068,899 | 11/1991 | Ellis et al. | 455/33 |

OTHER PUBLICATIONS

"Dual-Mode Subscriber Equipment-Network Equipment Compatibility Specification IS-54", §2.1.3.3.3; 2.1.3.3.4; 2.7.2; and 3.7.2, EIA Project No. 2215, Electronic Industries Association (Dec. 1989).

G. David Forney, Jr., "The Viterbi Algorithm", Proceedings of the IEEE, vol. 61, pp. 268-278 (Mar. 1973).

Sven Ekemark et al., "Modulation and Channel Coding in Digital Mobile Telephony", Nordic Semina. on Digital Land Mobile Radiocommunication, pp. 219-227, Espoo, Finland (Feb. 5-7, 1985).

Martin H. Weik, "Communications Standard Dictionary", 2d ed., pp. 211, 537-538, Van Nostrand Reinhold, New York (1989).

John G. Proakis, "Digital Communications", 2d ed., pp. 66-67, 362-363, 440-487, McGraw-Hill Book Co. (1989).

*Primary Examiner*—Charles E. Atkinson
*Assistant Examiner*—Phung My Chong
*Attorney, Agent, or Firm*—Burns, Doane, Swecker & Mathis

[57] ABSTRACT

In a mobile radio communications system, critical signaling messages, e.g., handoff messages, transmitted on a fast associated control channel and/or a slow associated control channel belonging to a digital traffic channel, are more heavily data protected than speech using convolutional coding and interburst interleaving. The coding and interburst interleaving are carried out so as to maintain compatibility with an exiting frame structure.

12 Claims, 3 Drawing Sheets

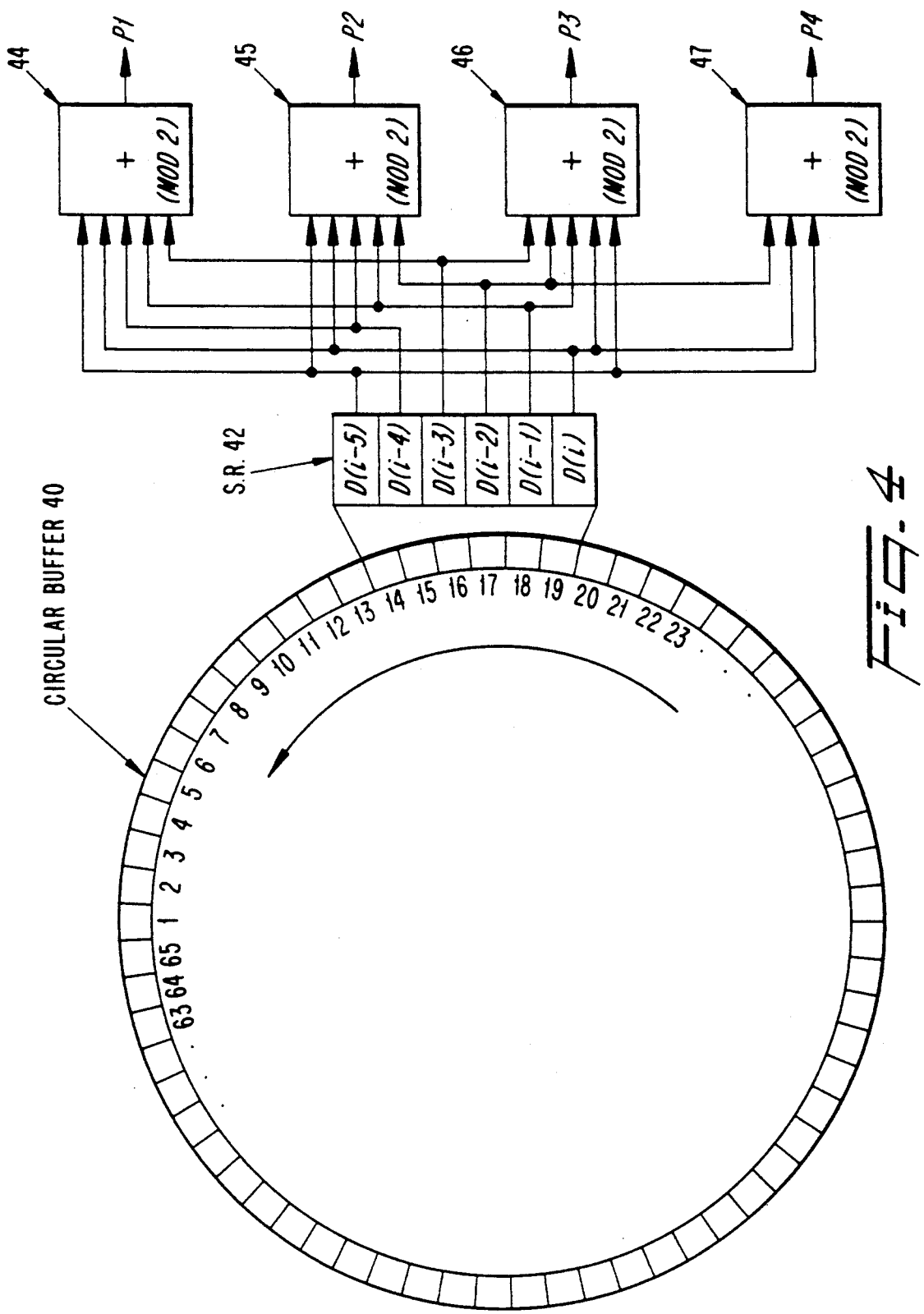

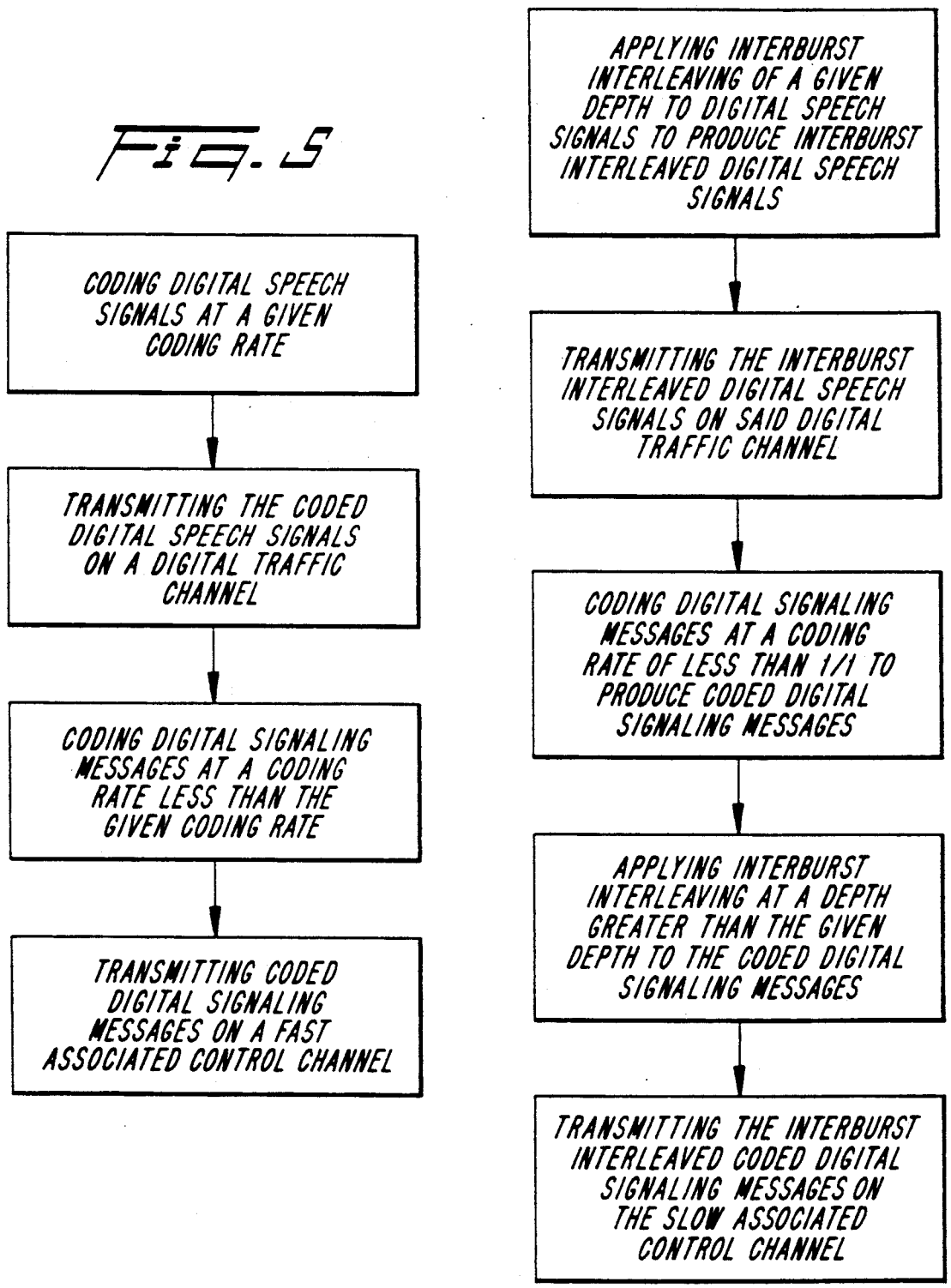

METHOD OF TRANSMITTING SIGNALING MESSAGES IN A MOBILE RADIO COMMUNICATION SYSTEM

This application is a continuation of application Ser. No. 07/497,517, filed Mar. 20, 1990, now abandoned.

TECHNICAL FIELD

This invention relates to mobile radio communication systems, especially cellular mobile telecommunication systems, and in particular to transmission of signaling messages in such systems.

BACKGROUND OF THE INVENTION

In a mobile radio communication system, especially a cellular mobile telecommunication system, it is essential that signaling messages are received correctly. This is especially the case for the handoff message or command sent by the land system to the mobile station. Since the transmission conditions normally experienced at the time of handoff usually are bad, handoff signaling and also other critical signaling messages need to be transmitted in a more reliable way than for instance speech, since loss of connection or other problems in the handling of a call are less acceptable to the user than casual disturbances to speech.

According to the standard EIA/TIA IS-54 of the Electronic Industries Association (EIA), sections 2.7.2 and 3.7.2, signaling words on the analog voice channel are repeated five times from mobile station to base station (up link) and eleven times from base station to mobile station (down link). This method has the drawback that it reduces throughput in an unacceptable way.

SUMMARY OF THE INVENTION

An object of the present invention is to provide a method of reliably transmitting signaling messages on at least one of the fast and the slow associated control channels, FACCH and SACCH, respectively, belonging to a digital voice channel in a cellular mobile telecommunication system.

In general terms this is done by protecting the messages more than speech on the digital voice channel.

A further object of the invention is to provide a method of reliably transmitting handoff messages on the fast associated control channel, FACCH.

According to a preferred embodiment of the invention this is done by coding the handoff messages by using a rate ¼ convolutional coding algorithm. A signaling message coded in this way replaced a speech block on the digital voice channel.

BRIEF DESCRIPTION OF THE DRAWINGS

The invention, together with further objects and advantages thereof, may best be understood by making reference to the following description taken together with the accompanying drawings, in which:

FIG. 4 is a diagram illustrating the coding algorithm in connection with the present invention; and FIG. 5 is a flow diagram of an embodiment of the present invention; and FIG. 6 is a flow diagram of another embodiment of the present invention.

DETAILED DESCRIPTION OF THE PREFERRED EMBODIMENTS

Figure 1:
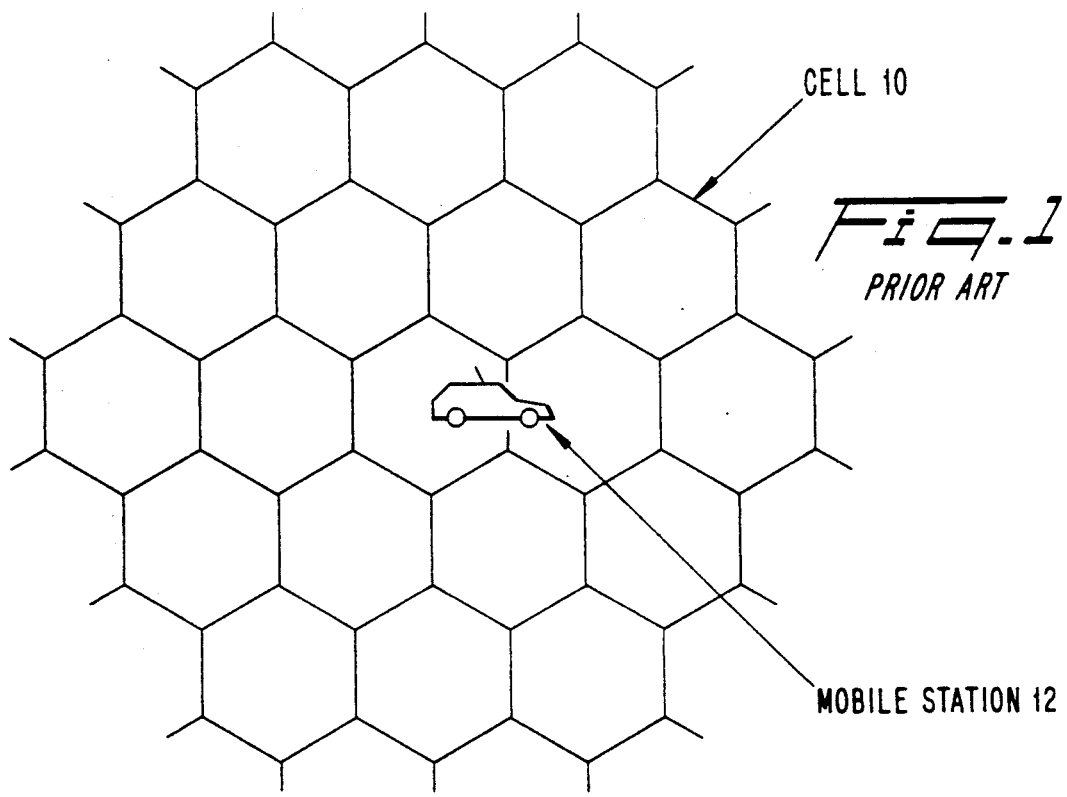
FIG. 1 is a diagram of a cellular mobile telecommunication system.

FIG. 1 illustrates the basic configuration of a cellular mobile telecommunication system. Such a system comprises a number of cells 10, each cell comprising a base station for radio communication with a number of mobile stations 12, of which only one is shown in the figure. Basically the mobile station 12 communicates with the base station of the cell 10 in which it is presently moving. As the mobile 12 moves from cell to cell, communication with the mobile station 12 is handed over from the base station of one cell 10 to the base station of another cell 10. This is called a handoff procedure. During a handoff procedure the old base station informs the mobile station 12 to switch communication to another channel of the new base station. This is done by a handoff command or message. However, since the reason for the handoff command in the first place is that the transmission conditions between the old base station and the mobile station 12 are no longer acceptable, there is a risk that the handoff command never reaches the mobile station 12 or cannot be interpreted correctly by said station. In such a case there is a possibility that the call might be lost. The object of the present invention is to protect the handoff command in such a way that the chances of correctly receiving it by the mobile station 12 are significantly increased.

Although this detailed description of preferred embodiments of the present invention will concentrate on the handoff command, it is to be understood that the same principles can also be used for other signaling messages, and that the invention is therefore not limited to handoff commands only.

Figure 2:
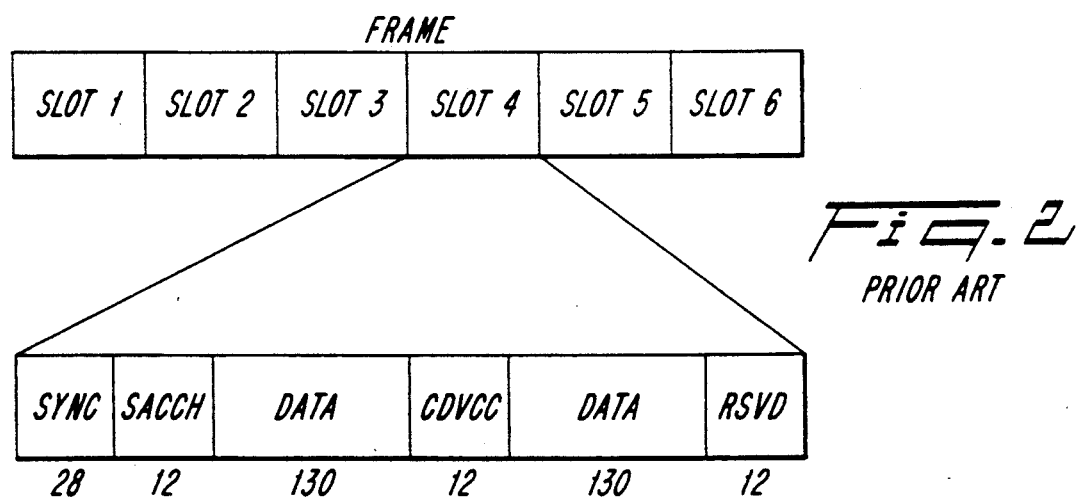
FIG. 2 is a diagram of the basic structure of a digital voice channel in a cellular mobile telecommunication system.

FIG. 2 illustrates the basic structure of information sent on a digital voice or traffic channel in a cellular mobile telecommunication system. The information may be sent in 25 frames per second. Each frame comprises six equally sized time slots (1–6). Each slot belongs to a specific communication channel. Each full rate communication channel uses two equally spaced time slots of the frame (1 and 4, 2 and 5, 3 and 6). Each half rate channel uses one time slot of the frame. As can be seen from the lower part of FIG. 2 each slot comprises six fields. The slot format shown in FIG. 2 is the format used from base station to mobile station. The slot format from mobile station to base station has the same length, but a different field structure.

The slot illustrated in FIG. 2 has the following fields:

SYNC is for synchronization and training and has a length of 28 bits

SACCH belongs to the slow associated control channel, which will be further described below, and has a length of 12 bits DATA normally comprises speech or other data information and has a length of 130 bits CDVCC contains the coded digital verification color code with a length of 12 bits DATA another data field with the same structure as the first mentioned data field RSVD reserved for future use and with a length of 12 bits In a full rate channel a 260 bit speech block is divided into two 130 bit halves which are mapped into two time slots of the same channel (1 and 4, for example). The first half of the current speech block is mapped into the 260 bits that are available in the two DATA fields of one time slot, and is also within the same time slot interleaved with the second half of the previous speech block. The second half of the current speech block is mapped into the next time slot and within that slot interleaved with the first half of the next speech block. Thus, speech has an interburst interleaving depth of 2. This procedure is described in detail in section 2.1.3.3.4 of the above mentioned standard.

Furthermore, before the speech blocks are sent to the interleaver the most sensitive bits have been protected by a rate ½ convolutional coding algorithm. This procedure is described in section 2.1.3.3.3 of the above mentioned standard.

The format of a slot used from mobile to base station is somewhat different from the slot format described above, but common features of both slot formats are that they both have a total DATA field of 260 bits and a 12 bit field for the slow associated control channel, SACCH.

The invention will now be described in detail in connection with signaling messages on the fast and slow associated control channels, FACCH and SACCH, respectively, and as illustrated in FIGS. 5 and 6.

The fast associated control channel, FACCH

The fast associated control channel, FACCH, is a signaling channel for the transmission of control and supervision messages between the base station and the mobile. The fast associated control channel, FACCH, by definition replaces the speech or user data block whenever system considerations deem it appropriate to do so. Thus, the FACCH is a blank and burst channel. For a full rate channel the FACCH by definition has an interburst interleaving of depth 2.

Figure 3:
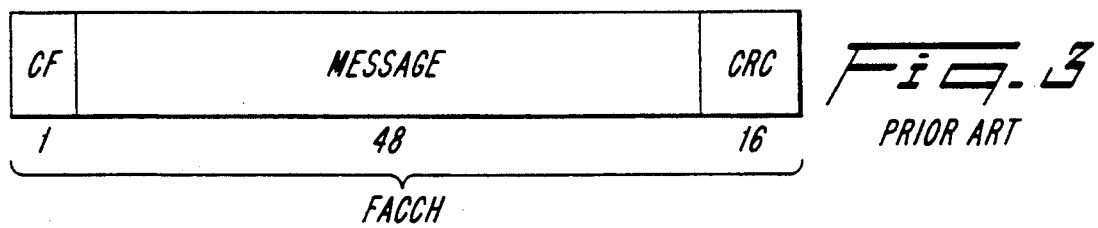
FIG. 3 is a diagram of the basic structure of a message on the fast, associated control channel, FACCH.

FIG. 3 illustrates the structure or format of a message word on the fast associated control channel, FACCH. Each message word comprises the following fields:

| Field | Contents |
|---|---|
| CF | a continuation flag of one bit. This flag indicates to the receiver whether a word is the first word in a message or if it is a subsequent word. |
| MESSAGE | a 48 bit message field containing the actual message, or part of the message in a multi word message. |
| CRC | a 16 bit cyclic redundancy check field. The 49 data bits in an FACCH word are appended with a 16 bit CRC to detect the presence of channel errors in the data as well as providing a mechanism for distinguishing FACCH data from speech data. The CRC is computed over the entire 49 data bits as well as the 8 bit DVCC preceding said 49 data bits. The CRC code is the standard CCITT CRC-16 code. One method of differentiating between speech blocks and FACCH blocks is to utilize the information present in the respective CRC fields. |

The total FACCH word, which comprises 65 bits, in the preferred embodiment is error protected by means of a rate ¼ convolutional code. The coding uses the same start and end bit (tail-biting), instead of extra tail bits, to avoid the overhead introduced with explicit tail bits.

The data to be encoded are shifted through a coding circuit. Such a coding circuit is illustrated in FIG. 4. Each new data bit shifted in results in four parity bits out of the encoder, which are designated P1-P4. One such bit quadruple is produced as a result of shifting in one new data bit. Each of the four parity bits is a different logical function of the new data bit and the five data bits previously shifted in.

As can be seen from FIG. 4 the coding circuit comprises a circular buffer 40 containing all the 65 bits of an FACCH word. If the bits are shifted around the buffer in the direction of the arrow, the necessary bits for producing signals P1-P4 can be taken from shift register 42. Denoting the latest data bit by D(i) and earlier data bits D(i−1), D(i−2), D(i−3), D(i−4) and D(i−5), the defining equations for P1, P2, P3, P4 are:

$$P1 = D(i) + D(i-1) + D(i-3) + D(i-4) + D(i-5)$$

$$P2 = D(i) + D(i-1) + D(i-2) + D(i-4) + D(i-5)$$

$$P3 = D(i) + D(i-1) + D(i-2) + D(i-3) + D(i-5)$$

$$P4 = D(i) + D(i-2) + D(i-5)$$

where + stands for modulo 2 addition (XOR).

These four equations are based on a specific choice of generator polynomials. It is to be understood that other choices of generator polynomials would lead to another set of four equations. Furthermore, as is understood by those skilled in the art, another coding rate, for example ⅛, would produce a different number of equations and therefore a different number of parity bits (8 in this case).

The above equations are represented by the interconnections between shift register 42 and adders 44, 45, 46 and 47 in FIG. 4.

Shift register 42 is initiated with the first six bits according to the following:

| D(i) | D(i-1) | D(i-2) | D(i-3) | D(i-4) | D(i-5) |   |
|---|---|---|---|---|---|---|
| 6 | 5 | 4 | 3 | 2 | 1 | bit |

The first bit quadruple P1, P2, P3, P4 is then generated and extracted. Thereafter the input bits are shifted around buffer 40 and thereby through shift register 42, so that bit 1 shifts out, bit 2 replaces bit 1, . . ., bit 6 replaces bit 5 and a new bit (bit 7) replaces bit 6 in D(i). After this shift the memory content is as follows:

| D(i) | D(i-1) | D(i-2) | D(i-3) | D(i-4) | D(i-5) |   |
|---|---|---|---|---|---|---|
| 7 | 6 | 5 | 4 | 3 | 2 | bit |

Another bit quadruple P1, P2, P3, P4 is then extracted and the procedure is repeated. After 59 shifts the state of the encoder is as follows:

| D(i) | D(i-1) | D(i-2) | D(i-3) | D(i-4) | D(i-5) |   |
|---|---|---|---|---|---|---|
| 65 | 64 | 63 | 62 | 61 | 60 | bit |

Thereafter the bits with index 1 to 5 are used again in that order. After these five last shifts shift register 42 contains:

| D(i) | D(i-1) | D(i-2) | D(i-3) | D(i-4) | D(i-5) |   |
|---|---|---|---|---|---|---|
| 5 | 4 | 3 | 2 | 1 | 65 | bit |

Thus, after one more shift the encoder state would return to the starting state. In principles it does not matter to the coding or decoding process where the beginning of the circular buffer is considered to be.

The described rate ¼ convolutional coding algorithm produces an FACCH block of 4×65=260 bits, that is of the same length as the speech block in a digital voice channel. Therefore the FACCH block can replace the speech (or user data) block whenever it is to be transmitted. Thus, the fast associated control channel is a blank and burst channel. Each FACCH block is regarded as one signaling word. As indicated above an FACCH message can consist of more than one such word, if necessary.

Before the FACCH block is transmitted it is interleaved over two consecutive bursts in the same manner as speech in accordance with the following procedure:

The coded FACCH bits are labelled from 0 to 259 with the following definition:

| Index | |
|---|---|
| 0 | P1 from first quadruple out of the encoder |
| 1 | P2 from first quadruple out of the encoder |
| 2 | P3 from first quadruple out of the encoder |
| 3 | P4 from first quadruple out of the encoder |
| . | . |
| . | . |
| . | . |
| 4 | P1 from second quadruple of of the encoder |
| 5 | P2 from second quadruple of of the encoder |
| . | . |
| . | . |
| . | . |
| 258 | P3 from 65 quadruple out of the encoder |
| 259 | P4 from 65 quadruple out of the encoder |

Bits with index 0 to 259 are interleaved according to the table below:

| ROW NUMBER | | | | | | | | | | |
|---|---|---|---|---|---|---|---|---|---|---|
| 0 | 215 | 256 | 223 | 258 | 230 | 219 | 257 | 227 | 259 | 189 |
| 1 | 0 | 25 | 50 | 75 | 231 | 89 | 114 | 139 | 164 | 190 |
| 2 | 1 | 26 | 51 | 76 | 232 | 90 | 115 | 140 | 165 | 191 |
| 3 | 2 | 27 | 52 | 77 | 233 | 91 | 116 | 141 | 166 | 192 |
| 4 | 3 | 28 | 53 | 78 | 234 | 92 | 117 | 142 | 167 | 193 |
| 5 | 4 | 29 | 54 | 79 | 235 | 93 | 118 | 143 | 168 | 194 |
| 6 | 5 | 30 | 55 | 80 | 236 | 94 | 119 | 144 | 169 | 195 |
| 7 | 6 | 31 | 56 | 81 | 237 | 95 | 120 | 145 | 170 | 196 |
| 8 | 7 | 32 | 57 | 82 | 238 | 96 | 121 | 146 | 171 | 197 |
| 9 | 8 | 33 | 58 | 83 | 239 | 97 | 122 | 147 | 172 | 198 |
| 10 | 9 | 34 | 59 | 84 | 240 | 98 | 123 | 148 | 173 | 199 |
| 11 | 10 | 35 | 60 | 85 | 241 | 99 | 124 | 149 | 174 | 200 |
| 12 | 11 | 36 | 61 | 86 | 242 | 100 | 125 | 150 | 175 | 201 |
| 13 | 12 | 37 | 62 | 87 | 243 | 101 | 126 | 151 | 176 | 202 |
| 14 | 13 | 38 | 63 | 88 | 244 | 102 | 127 | 152 | 177 | 203 |
| 15 | 14 | 39 | 64 | 216 | 245 | 103 | 128 | 153 | 178 | 204 |
| 16 | 15 | 40 | 65 | 217 | 246 | 104 | 129 | 154 | 179 | 205 |
| 17 | 16 | 41 | 66 | 218 | 247 | 105 | 130 | 155 | 180 | 206 |
| 18 | 17 | 42 | 67 | 220 | 248 | 106 | 131 | 156 | 181 | 207 |
| 19 | 18 | 43 | 68 | 221 | 249 | 107 | 132 | 157 | 182 | 208 |
| 20 | 19 | 44 | 69 | 222 | 250 | 108 | 133 | 158 | 183 | 209 |
| 21 | 20 | 45 | 70 | 224 | 251 | 109 | 134 | 159 | 184 | 210 |
| 22 | 21 | 46 | 71 | 225 | 252 | 110 | 135 | 160 | 185 | 211 |
| 23 | 22 | 47 | 72 | 226 | 253 | 111 | 136 | 161 | 186 | 212 |
| 24 | 23 | 48 | 73 | 228 | 254 | 112 | 137 | 162 | 187 | 213 |
| 25 | 24 | 49 | 74 | 229 | 255 | 113 | 138 | 163 | 188 | 214 |

The bits are transmitted from the interleaving array along rows from left to right, using only odd numbered rows for the current block alternately with even numbered rows of the previous block, which even numbered rows can be from a similar speech or FACCH block.

The even numbered rows of an interleaved FACCH of the current block will be transmitted in the next burst, alternating with odd numbered rows from the following block, which may also be a speech or FACCH block.

After the message has been sent over the fast associated control channel, FACCH, the received data has to be de-interleaved to reconstruct the original FACCH blocks. Thereafter each FACCH block, which was originally convolutionally encoded, must now be decoded. Any known decoding technique for convolutional codes may be used. One suitable method is the Viterbi algorithm, which is described in for instance(the article by G. David Forney, Jr., "The Viterbi Algorithm", PROCEEDINGS OF THE IEEE, March, 1973, pp. 268-78.

The format of the 48 bits in the message field of FIG. 3 depends on the specific message. As an example, the handoff message that is sent from the base station to the mobile station to order the mobile station from one traffic channel to another has the following format:

| Information element | Length (bits) |
|---|---|
| Message Type | 8 |
| Protocol Discr. | 2 |
| RF Channel | 11 |
| Rate | 1 |
| Timeslot Indicator | 3 |
| Color code SAT/DVCC | 8 |
| VMAC | 3 |
| Time Alignment | 5 |
| Shortened Burst | 2 |

As can be seen from this table, the total length of the handoff message is 43 bits. The remaining five bits are padded with zeros.

In summary, messages on the FACCH may be protected more than speech by using the same interburst interleaving depth as for speech but a lower coding rate.

The slow associated control channel, SACCH

The SACCH is a signaling channel for transmission of control and supervision messages between the base station and a mobile. The SACCH is obtained by including 12 coded bits in every slot, as indicated in FIG. 2. Thus, the SACCH is continuous in the sense that it exists in parallell with and does not interrupt the corresponding speech or user data stream.

The SACCH data stream may be error protected, for example, by means of a rate ⅓ convolutional coding algorithm. The coding is continuous and requires no start bits, tail bits, nor other form of explicit block synchronization since the CRC can be used to synchronize to the messages.

For every slot four new SACCH data bits to be encoded are shifted through a coding circuit. Each new data bit shifted in results in three parity bits out of the encoder, which bits are designated P1, P2, P3. Four such bit triples are produced as a result of shifting in the four new data bits, thereby forming a 12-bit word that becomes an input word to the interburst interleaving algorithm that is described below.

Each of the three parity bits is a different logical function of the new data bit and the five data bits previously shifted in. Denoting the new data bit by D(i) and earlier data bits by D(i−1), D(i−2), D(i−3), D(i−4) and D(i−5), the defining equations for P1, P2, P3 may be chosen as:

$$P1 = D(i) + D(i-1) + D(i-3) + D(i-4) + D(i-5)$$

$$P2 = D(i) + D(i-1) + D(i-2) + D(i-3) + D(i-5)$$

$$P3 = D(i) + D(i-2) + D(i-5)$$

where + stands for modulo 2 addition (XOR).

As was the case with the fast associated control channel, FACCH, these equations depend on the chosen generator polynomials. Furthermore, as is understood by those skilled in the art, another coding rate, for example ½, would produce a different number of equations and therefore a different number of parity bits (2 in this case).

The four bit triples obtained from the four data bits corresponding to each slot are assembled into 12-bit words in the following format:

| Fourth bit | Third bit | Second bit | First bit |
|---|---|---|---|
| [(P1, P2, P3) | (P1, P2, P3) | (P1, P2, P3) | (P1, P2, P3)] |

After this rate ⅓ continuous convolutional coding the data stream is subjected to a continuous diagonal interleaving process.

The SACCH interburst interleaving is of a diagonal type that does not require explicit block synchronization. The interleaver and de-interleaver thus need only to execute the same algorithm for every slot and do not require to distinguish slots from different frames. Thus, the SACCH interburst interleaving is self-synchronized.

The interleaving and de-interleaving algorithms are in principle identical, allowing possible reuse of hardware or code for cost economy. The interleaving/de-interleaving algorithm is defined with the aid of the following notation:

Lower case indexed variables a1, a2, ..., b1, b2, ..., c1, c2, ..., etc. are used to represent bit values. Since 12 such bit values are carried in each slot, the assembly of 12 such bits into a 12-bit word or array is denoted by capital letters A, B, C, ... etc., where $$A = (a12, a11, a10, a9, a8, \ldots, a3, a2, a1)$$
$$B = (b12, b11, b10, b9, b8, \ldots, b3, b2, b1)$$
$$C = \quad .$$
$$D = \quad .$$
$$\vdots$$
$$M = (m12, m11, m10, m9, m8, \ldots, m3, m2, m1)$$

etc.

represent successive 12-bit arrays presented to the input of the interleaving/de-interleaving algorithm.

Successive 12-bit output words or arrays will then be:

(a1, b2, c3, d4, e5, ..., k11, l12) carried in frame Z
(b1, c2, d3, e4, f5, ..., l11, m12) carried in frame Z + 1
(c1, d2, e3, f4, g5, ..., m11, n12) carried in frame Z + 2 etc.

The table below explains the algorithm in terms of a shift-register implementation. A stack of 12 twelve-bit shift-registers are used as the interleaving memory. The topmost register is currently empty. The second register contains one bit from a previously input word. The third register contains two bits from two previously input words, and so on to the twelfth register at the bottom of the stack, which contains 11 bits from 11 different previously input words and is only awaiting one more bit to be complete.

|    |    |    |    |    |    |    |    |    |    |    |    |     |   |     |   |
|----|----|----|----|----|----|----|----|----|----|----|----|-----|---|-----|---|
|    |    |    |    |    |    |    |    |    |    |    |    |     |   | ←11 |   |
|    |    |    |    |    |    |    |    |    |    |    |    | k1  |   | ←12 |   |
|    |    |    |    |    |    |    |    |    |    |    | j1 | k2  |   | ←13 |   |
|    |    |    |    |    |    |    |    |    |    | i1 | j2 | k3  | S | ←14 |   |
|    |    |    |    |    |    |    |    |    | h1 | i2 | j3 | k4  | H | ←15 |   |
|    |    |    |    |    |    |    |    | g1 | h2 | i3 | j4 | k5  | I | ←16 |   |
|    |    |    |    |    |    |    | f1 | g2 | h3 | i4 | j5 | k6  | F | ←17 | L |
|    |    |    |    |    |    | e1 | f2 | g3 | h4 | i5 | j6 | k7  | T | ←18 |   |
|    |    |    |    |    | d1 | e2 | f3 | g4 | h5 | i6 | j7 | k8  |   | ←19 |   |
|    |    |    |    | c1 | d2 | e3 | f4 | g5 | h6 | i7 | j8 | k9  | I | ←   |   |
|    |    |    |    |    |    |    |    |    |    |    |    |     |   | l10 |   |
|    |    |    | b1 | c2 | d3 | e4 | f5 | g6 | h7 | i8 | j9 | k10 | N | ←   |   |
|    |    |    |    |    |    |    |    |    |    |    |    |     |   | l11 |   |
| a1 | b2 | c3 | d4 | e5 | f6 | g7 | h8 | i9 | j10| k11|    |     |   | ←   |   |
|    |    |    |    |    |    |    |    |    |    |    |    |     |   | l12 |   |

The new 12-bit array L is then shifted in as indicated. The least significant bit of L shifts into the least significant bit of the top register. The most significant bit of L shifts into the least significant bit of the bottom register. The bottom register will now contain a complete set of 12 bits as follows:

| a1 | b2 | c3 | e5 | f6 | g7 | h8 | i9 | j10 | k11 | l12 |
|---|---|---|---|---|---|---|---|---|---|---|

The contents of the bottom register is then removed from the stack as the interleaver output word.

Thereafter the stack is pushed down and an empty register is placed on the top of the stack ready for the next iteration.

The register previously second from the bottom is now at the bottom of the stack and contains 11 bits. After shifting in the next input word it will become complete and is extracted as:

| b1 | c2 | d3 | e4 | f5 | g6 | h7 | i8 | j9 | k10 | l11 | m12 |

Each bit of one 12-bit input word is thus distributed over different bit positions in 12 different output words, and thus over slots in 12 different frames. The total delay in going through the interleaver and de-interleaver is 12 frames.

After the message has been sent over the slow associated control channel, SACCH, and de-interleaved in accordance with the process described above, the received signal is decoded. As was the case with the fast associated control channel, FACCH, the Viterbi algorithm is suitable for this purpose.

In summary, in the case of the SACCH the messages may be protected more than speech by using a coding algorithm with a coding rate less than 1/1 and an interburst interleaving depth which is deeper than for speech, in the preferred embodiment an interburst interleaving rate of 12 was used.

From the above description it is clear that message protection in principle is obtained by the same general method for both the FACCH and the SACCH, namely by using a coding algorithm with a coding rate less than 1/1 (that is, the coding produces redundancy) in combination with interburst interleaving (interleaving splits burst errors, which makes it easier for the channel decoder to handle isolated errors due to Rayleigh fading, see for example Sven Ekemark et al, "Modulation and Channel Coding in Digital Mobile Telephony", Nordic Seminar on Land Mobile Radio Communication, Feb. 5-7, 1985, Espoo, Finland). For the FACCH a relatively shallow interburst interleaving depth is compensated by a relatively low coding rate. For the SACCH a higher coding rate is compensated by deep interburst interleaving. In both cases, however, the desired protection is obtained by the chosen combination.

So far it has been described how messages can be protected on the fast and slow control channels, FACCH and SACCH, respectively. Further protection of critical messages, for instance the handoff order, can be obtained by retransmission of the coded message if acknowledgement is not received within a specified time period, by sending the message repeatedly in one sequence until acknowledgement is received, by sending the message repeatedly a fixed number of times without requiring acknowledgement, or by sending the message repeatedly a fixed number of times or until acknowledgement has been received.

From the above description it is clear that the present invention protects signaling messages more than speech. Since frequency planning is done for speech this feature means that signaling is possible even when speech quality is very low. This also means that if it is decided that speech should be protected more than it is today, signaling should also be more protected in order to guarantee that this relative difference in protection is maintained. Thus, speech and not signaling should be the limiting factor of the communication system.

The invention has been described in connection with a cellular mobile telecommunication system. However, the same principles are also useful in other mobile radio communication systems, for example paging systems.

It will be understood by those skilled in the art that various modifications and changes may be made to the present invention without departure from the spirit and scope thereof, which is defined by the appended claims.

We claim:

1. A method of transmitting signaling messages on a fast associated control channel belonging to a digital traffic channel in a mobile radio communication system, comprising the steps of:
   coding digital speech signals at a given coding rate to produce coded digital speech signals;
   transmitting said coded digital speech signals on said digital traffic channel;
   coding digital signaling messages at a coding rate less than said given coding rate to produce coded digital signaling messages with more data redundancy than said coded digital speech signals; and
   transmitting coded digital signaling messages on said fast associated control channel belonging to said digital traffic channel.

2. The method of claim 1, wherein said digital signaling messages are coded using a rate $\frac{1}{4}$ convolutional coding algorithm.

3. The method of claim 2, comprising the further steps of:
   dividing said coded digital speech signals and said coded digital signaling messages into blocks of coded digital speech signals and blocks of coded digital signaling messages; and
   whenever a block of a coded digital signaling message is to be transmitted, substituting said block of said coded digital signaling messages for a block of coded digital speech signals which would have been normally transmitted.

4. The method of claim 3, comprising the further steps of:
   applying a given type of interburst interleaving to said blocks of coded digital speech signals; and
   applying the same type of interburst interleaving to said blocks of coded digital signaling messages.

5. The method of claim 1, wherein said digital signaling messages comprise handoff messages.

6. The method of claim 1, comprising the further steps of:
   once a digital signaling messages has been transmitted, awaiting a return acknowledgement of said digital signaling messages; and
   if said acknowledgement has not been received within a prescribed period of time, retransmitting said digital signaling messages.

7. The method of claim 1, comprising the further steps of:
   once a digital signaling message has been transmitted, awaiting a return acknowledgement of said digital signaling message; and
   retransmitting said digital signaling message at predetermined intervals until said acknowledgement has been received.

8. The method of claim 1, comprising the further step of:
   retransmitting each digital signaling message a predetermined number of times.

9. A method of transmitting signaling messages on a slow associated control channel belonging to a digital traffic channel in a mobile radio communication system, comprising the steps of:
   applying interburst interleaving of a given interburst interleaving depth to digital speech signals to produce interburst interleaved digital speech signals;
   transmitting said interburst interleaved digital speech signals on said digital traffic channel;

coding digital signaling messages at a coding rate of less than 1/1 to produce coded digital signaling messages;

applying interburst interleaving, of an interburst interleaving depth greater than said given interburst interleaving depth, to said coded digital signaling messages to produce interburst interleaved coded digital signaling messages; and transmitting said interburst interleaved coded digital signaling messages on said slow associated control channel belonging to said digital traffic channel.

10. The method of claim 9, wherein said interburst interleaving applied to said coded digital signaling messages is of a diagonal self-synchronized type.

11. The method of claim 10, wherein said interburst interleaving depth of said interburst interleaving applied to said coded digital signaling messages equals 12.

12. The method of claim 9, wherein said digital signaling messages are coded using a rate ½ continuous convolutional coding algorithm.

* * * * *